(12) United States Patent
Hirai et al.

(10) Patent No.: US 9,922,595 B2
(45) Date of Patent: Mar. 20, 2018

(54) PIXEL STRUCTURE FOR OLED DISPLAY PANEL

(71) Applicant: COMMONWEALTH SCIENTIFIC AND INDUSTRIAL RESEARCH ORGANISATION, Acton, ACT (AU)

(72) Inventors: Tadahiko Hirai, Mount Waverly (AU); Kazunori Ueno, Glen Waverly (AU)

(73) Assignee: COMMONWEALTH SCIENTIFIC AND INDUSTRIAL RESEARCH ORGANISATION, Acton, ACT (AU)

(*) Notice: Subject to any disclaimer, the term of this patent is extended or adjusted under 35 U.S.C. 154(b) by 0 days.

(21) Appl. No.: 15/308,684

(22) PCT Filed: May 5, 2015

(86) PCT No.: PCT/AU2015/000267
§ 371 (c)(1),
(2) Date: Nov. 3, 2016

(87) PCT Pub. No.: WO2015/168725
PCT Pub. Date: Nov. 12, 2015

(65) Prior Publication Data
US 2017/0186368 A1   Jun. 29, 2017

(30) Foreign Application Priority Data

May 5, 2014 (AU) ................................ 2014901638

(51) Int. Cl.
*H01L 25/075* (2006.01)
*H01L 33/08* (2010.01)
(Continued)

(52) U.S. Cl.
CPC ......... *G09G 3/3225* (2013.01); *H01L 27/326* (2013.01); *H01L 27/3265* (2013.01);
(Continued)

(58) Field of Classification Search
CPC ....... H01L 25/075; H01L 27/15; H01L 33/08; H01L 25/167; H01L 31/125; H01L 31/153; H01L 31/173; H01L 31/12; H01L 33/00
See application file for complete search history.

(56) References Cited

U.S. PATENT DOCUMENTS

| 2011/0234550 A1 | 9/2011 | Hong et al. |
| 2013/0062635 A1 | 3/2013 | Higo et al. |

(Continued)

FOREIGN PATENT DOCUMENTS

EP           2541603 A2    1/2013

OTHER PUBLICATIONS

International Search Report dated Sep. 15, 2015 in application No. PCT/AU2015/000267.

*Primary Examiner* — Sonya D McCall Shepard
(74) *Attorney, Agent, or Firm* — Foley & Lardner LLP

(57) ABSTRACT

A pixel structure for use in a high-definition light-emitting display panel having a plurality of sub-pixels, comprising: a glass substrate; a backplane that is disposed on the glass substrate and includes a capacitive element having sufficiently high light transmittance to cause 50 percent or more of light to be transmitted therethrough; a frontplane that is disposed on the backplane and includes a light-emitting element disposed so as to radiate light towards the glass substrate and the backplane; an electrical connecting portion that provides an electrical connection between the frontplane and the backplane, three or fewer of such electrical connecting portions being provided on one of the sub-pixels; and a switching element that is provided on the backplane and controls electricity distribution to the light-emitting element, wherein an aperture ratio from which light is transmitted through the glass substrate is 20 percent or more.

21 Claims, 9 Drawing Sheets

(51) Int. Cl.
*H01L 27/15* (2006.01)
*H01L 33/00* (2010.01)
*G09G 3/3225* (2016.01)
*H01L 27/32* (2006.01)

(52) U.S. Cl.
CPC . *H01L 27/3276* (2013.01); *G09G 2310/0262* (2013.01); *G09G 2330/10* (2013.01)

(56) References Cited

U.S. PATENT DOCUMENTS

2013/0105843 A1* 5/2013 Lee .................... C23C 14/24
  257/98
2013/0214278 A1 8/2013 Nam et al.
2013/0320314 A1* 12/2013 Kim .................... H01L 51/52
  257/40

* cited by examiner

PIXEL STRUCTURE FOR OLED DISPLAY PANEL

TECHNICAL FIELD

The present invention relates to a pixel structure for use in a high-definition light-emitting display panel and to an organic electroluminescence display using that pixel structure.

BACKGROUND ART

Display panels using a two-terminal display device that emits light at luminous intensity corresponding to a direct current level, such as an organic electroluminescence element or organic light-emitting diode (OLED); namely, organic electroluminescence (EL) devices, have recently been developed.

Implementation of a high-luminance, high-contrast image display requires an active drive using a switching element, for example, a thin film transistor (TFT). Typically, an OLED is a light emitting device that has a laminated structure of a thin organic material and changes emission intensity according to the level of an electric current running through the OLED. A display unit that displays an image can be configured by using TFTs to pass an electric current through the OLED provided on each pixel or sub-pixel disposed on a matrix and thereby allow it to emit light.

FIG. 1 shows a basic configuration of a display unit that employs an OLED (see Non Patent Literature NPL1). An OLED display unit is composed of a backplane 100 having a TFT (or other switching element) 20, a capacitive element (capacitor) 30, and a wire 40 disposed on a glass substrate 10, and a frontplane 150 having an OLED 120 disposed thereon. The OLED display unit is classified into two types according to the direction in which light is emitted by the OLED 120; one is bottom emission type (see FIG. 1(*a*)) in which is light emitted by the OLED mainly through the backplane 100, and the other is top emission type (see FIG. 1(*b*)) in which light is emitted by the OLED mainly through the frontplate 150, rather than through the backplane 100.

In the bottom emission type, an indium tin oxide (ITO) transparent conductive film 60 is formed on the backplane 100 provided on the glass substrate 10 for injecting holes, and then the OLED 120 is formed on the transparent conductive film 60. This type allows the manufacture of display units using processes that are at low temperature and free from oxygen following the formation of the OLED 120, providing advantages of implementing a relatively simplified manufacturing process that gives no damage to the organic material. However, this type has a structure where light passes through the backplane 100 having the TFT 20 and the wire 40 disposed thereon, placing restrictions on an opening area. In particular, this type has the disadvantage of an extremely small aperture ratio in high-definition display units.

The top emission type has to have an ITO transparent conductive film 61 formed on an organic material, due to the necessity to emit light through the frontplate 150' (opposite side of the backplane 100'). Formation of the ITO transparent conductive film uses oxygen plasma processes including a heating process in some instances, and as a result the organic material on the OLED 120' tends to sustain damage. In addition, oxygen/water content absorbers must be provided on the side through which light is taken out, resulting in a complicated structure which has disadvantages of making the manufacturing process relatively complicated. However, this type has fewer restrictions caused by the backplane 100' on an opening area through which light is emitted, since light does not pass through the backplane 100' having the TFT 20' and the wire 40' disposed thereon. In particular, this type has the potential advantage of a relatively large aperture ratio in the high-definition display units. In practice, however, a large aperture ratio has not been achieved to date, since a planarization layer formed between the backplane 100' and the frontplane 150' has difficulty in functioning at an end of the wire.

On the other hand, an attempt has been made to make the aperture ratio greater in the bottom emission type, as proposed in some patent literature (see Patent Literature PTL1, PTL2 and PTL 3). These documents propose that the capacitive element 30 and wire 40 disposed on the backplane 100 are made transparent to achieve an increased aperture ratio. The transparent capacitive element 30 has been found to have the effect of ensuring such an increased aperture ratio. The transparent wire 40, however, has not been successfully implemented, due to the difficulty in withstanding microfabrication and providing sufficient conductivity.

Recently, demand has been increasing for higher definition display units.

OLED display units designed for use in mobile devices which have recently been gaining attention require high definition that ranges from 300 ppi (pixels per inch) up to 400 ppi. In a high-definition OLED display unit of 400 ppi, for example, one pixel has a size of 60 microns square, making it very difficult to simultaneously achieve large aperture ratio, low cost, high reliability, and stable manufacturing processes. Currently known technologies achieve an aperture ratio of about 20 percent for the top emission type, but this is not satisfactory in ensuring low cost and reliability.

It would be desirable in a high-definition OLED display unit of 300 ppi or more, to provide a high-definition display panel pixel structure and an organic electroluminescence display using such a pixel structure which achieves a light-extraction aperture ratio of 20 percent or more despite the use of a bottom emission type that provides a relatively simplified manufacturing process with less damage to an organic material.

SUMMARY

One aspect of the invention provides a pixel structure for use in a high-definition light-emitting display panel having a plurality of sub-pixels, comprising: a glass substrate; a backplane that is disposed on the glass substrate and includes a capacitive element having sufficiently high light transmittance to cause 50 percent or more of light to be transmitted therethrough; a frontplane that is disposed on the backplane and includes a light-emitting element disposed so as to radiate light towards the glass substrate and the backplane; an electrical connecting portion that provides an electrical connection between the frontplane and the backplane, three or fewer of such electrical connecting portions being provided on one of the sub-pixels; and a switching element that is provided on the backplane and controls electricity distribution to the light-emitting element, wherein an aperture ratio from which light is transmitted through the glass substrate is 20 percent or more.

In one or more embodiments the capacitive element has a conductive layer; the backplane includes at least one wire; and the conductive layer is substantially polygonal and its side is in electrical contact with or integral with at least one of the wires.

In one or more embodiments the capacitive element has an insulating layer; at least one wire including the internal wire inside the backplane is located in a layer above the insulating layer of the capacitive element that causes light to be transmitted therethrough.

In one or more embodiments the capacitive element has the conductive layer; and at least one wire including the internal wire inside the backplane is integral with the conductive layer of the capacitive element.

In one or more embodiments the switch is a thin film transistor having an active layer of a silicon, metallic oxide, or organic matter.

In one or more embodiments the backplane includes a linear wiring pattern extending in the pixel; the switch is the thin film transistor; and an end of the linear wiring pattern is applied as source and drain electrode terminals of the thin film transistor.

In one or more embodiments the total number of photo masks and metal masks for use in a manufacturing process is 15 or fewer.

In one or more embodiments four or fewer of the thin film transistors are provided for one of the sub-pixels.

In one or more embodiments two of the electrical connecting portions that provide an electrical connection between the frontplane and the backplane are provided for one of the sub-pixels.

In one or more embodiments one of the electrical connecting portions that provide an electrical connection between the frontplane and the backplane is provided for one of the sub-pixels.

In one or more embodiments the capacitive element causes 50 percent or more of light to be transmitted therethrough in a visible light region.

In one or more embodiments the capacitive element is disposed in the backplane.

In one or more embodiments the capacitive element is disposed so as to be in contact with the glass substrate.

In one or more embodiments 50 percent or more of an area occupied by the capacitive element is disposed so as to be overlapped with the light-emitting element, when viewed from the outside of the glass substrate.

In one or more embodiments an insulating planarization layer is disposed on the backplane.

In one or more embodiments a portion on the side of the frontplane in the planarization layer has a surface flatness of Ra of not more than 10 nm.

In one or more embodiments at least one of the electrical connecting portions that provide an electrical connection between the frontplane and the backplane is disposed so as to connect one electrode of the switching element included in the backplane and a hole-injecting side electrode of the light-emitting element included in the frontplane.

In one or more embodiments an electron injecting side electrode of the light-emitting element included in the frontplane is provided with a wire and does not include in one of the sub-pixels the electrical connecting portion that provides an electrical connection between the frontplane and the backplane.

In one or more embodiments the frontplane and the backplane respectively include at least one earth line.

In one or more embodiments one of the sub-pixels includes at least two switching elements, at least one capacitive element, and at least one light-emitting element.

In one or more embodiments one of the sub-pixels includes a wire for measurement of the voltage of one electrode of the light-emitting element.

In one or more embodiments one of the sub-pixels includes a wire for adjustment of the voltage of one electrode of the capacitive element.

In one or more embodiments a wire in one of the sub-pixels, the switching element, and the capacitive element have a minimum micro-machining line width of 3 microns or less.

Another aspect of the invention provides an organic electroluminescence display unit, including a high definition light emitting display panel having a pixel structure as described hereabove.

BRIEF DESCRIPTION OF DRAWINGS

Exemplary, non-limiting embodiments of the present invention will be described below with reference to the accompanying drawings.

DETAILED DESCRIPTION OF DRAWINGS

[First Embodiment]

Figure 1:
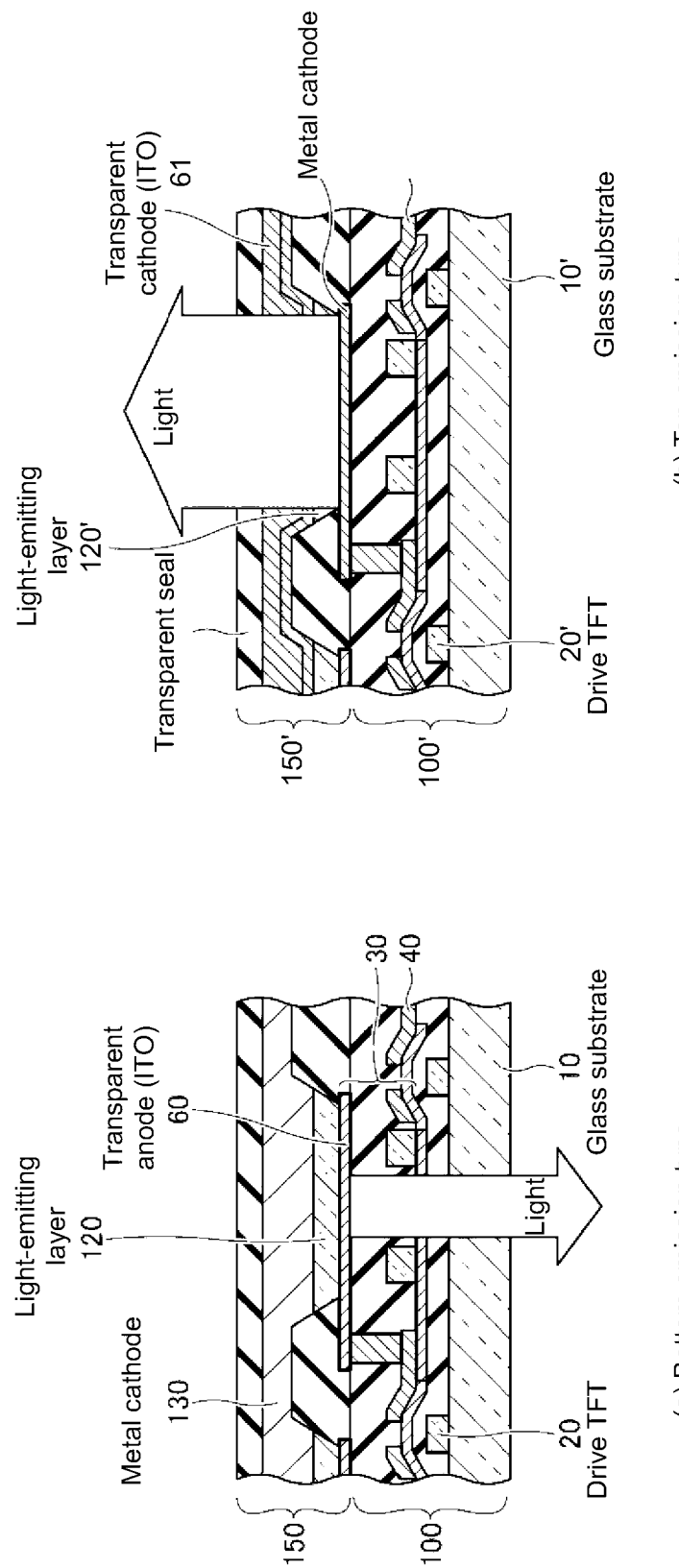
FIG. 1 is a diagram showing a basic configuration of a display unit that employs an OLED based on Non Patent Literature 1.
Figure 2:
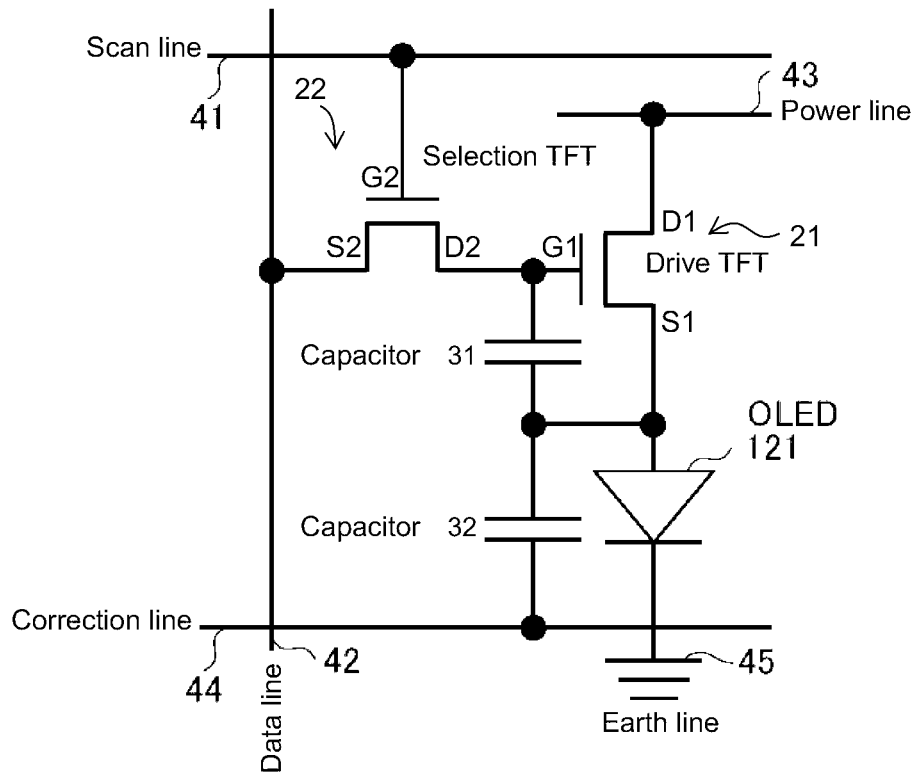
FIG. 2 is a circuit diagram of a sub-pixel as an example which shows a high-definition light-emitting display panel pixel structure according to a first embodiment of the present invention.

FIG. 2 is a circuit diagram of a sub-pixel serving as an example which shows a high-definition light-emitting display panel pixel structure according to a first embodiment of the present invention. In the first embodiment, one sub-pixel has two TFTs 21, 22, two capacitive elements (capacitors) 31, 32, and one OLED 121, which are connected to a scan line 41, a data line 42, a power line 43, a correction line 44, and an earth line 45.

In FIG. 2, the TFTs 21, 22 are both n-channel type junction field-effect transistors. The drain D1 of the drive TFT 21 is connected to the power line 43, and its source S1 is connected to the anode of the OLED 121. The cathode of the OLED 121 is connected to the earth line 45. The gate G1 of the drive TFT 21 is connected to one electrode of the capacitor 31 and the drain D2 of the selection TFT 22. The gate G2 of the selection TFT 22 is connected to the scan line 41, while its source S2 is connected to the data line 42. The other electrode of the capacitor 31 is connected to the anode of the OLED 121 and one electrode of the capacitor 32. The other electrode of the capacitor 32 is connected to the correction line 44.

When a voltage is applied to the gate G2 of the selection TFT 22 through the scan line 41, the selection TFT 22 becomes activated, causing a data signal (voltage) applied to the data line 42 to be applied to the gate G1 of the drive TFT 21. This results in a predetermined current flowing to the OLED 71, causing the OLED 121 to emit light at luminous intensity corresponding to the data signal. When no voltage is present on the scan line 41, the selection TFT 22 becomes deactivated, but the gate voltage of the drive TFT 21 is maintained at a constant level by the capacitors 31, 32 until a scan voltage is applied again.

The voltage of the correction line 44 may be normally a ground voltage if degradation of the OLED 121 is negligibly small. If the degradation of the OLED 121 causes luminous intensity corresponding to a predetermined signal to become insufficient, the luminous intensity can be corrected by applying a correction voltage during a transition to the data voltage holding.

Table 1 below shows sub-pixel design conditions under which a high-definition light-emitting display panel pixel structure according to a first embodiment is implemented.

TABLE 1

| Definition | 400 ppi |
| --- | --- |
| Pixel size | 63 × 63 μm$^2$ |
| Sub-pixel size | 63 × 21 μm$^2$ |
| Sub-pixel circuit | 2-Tr, 2-Cap, 1-OLED |
| Sub-pixel configuration | Bottom emission<br>Transparent capacity<br>Minimum working size: 3.0 μm<br>VIA, two<br>TFT low-temperature poly-silicon (LTPS)<br>Number of masks: 12 |
| Drive circuit | Voltage program, no compensating circuit, correction line provided |

In this embodiment, a 400 ppi high-definition light-emitting display panel has been designed as the bottom emission type. One pixel is composed of three sub-pixels; red (R), green (G), and blue (B). As shown in Table 1, one sub-pixel has a size of 63 microns by 21 microns, while one pixel has a size of 63 microns by 63 microns. As described above, one sub-pixel includes the two TFTs 21, 22, the two capacitive elements (capacitors) 31, 32, and the OLED 121. The capacitive elements 31, 32 cause 50 percent or more of light in a visible region to be transmitted therethrough; namely, they have sufficiently high light transmittance to cause 50 percent or more of light in a visible light region to be transmitted therethrough. The TFTs 21, 22 have their active layer formed of low temperature polycrystalline silicon (LTPS). The TFTs 21, 22, the wires 41 through 45, and the OLED 121 have a minimum working size of 3 microns. Two electrical connecting portions (VIA) electrically connecting the frontplane and the backplane are provided for one sub-pixel.

Figure 3:
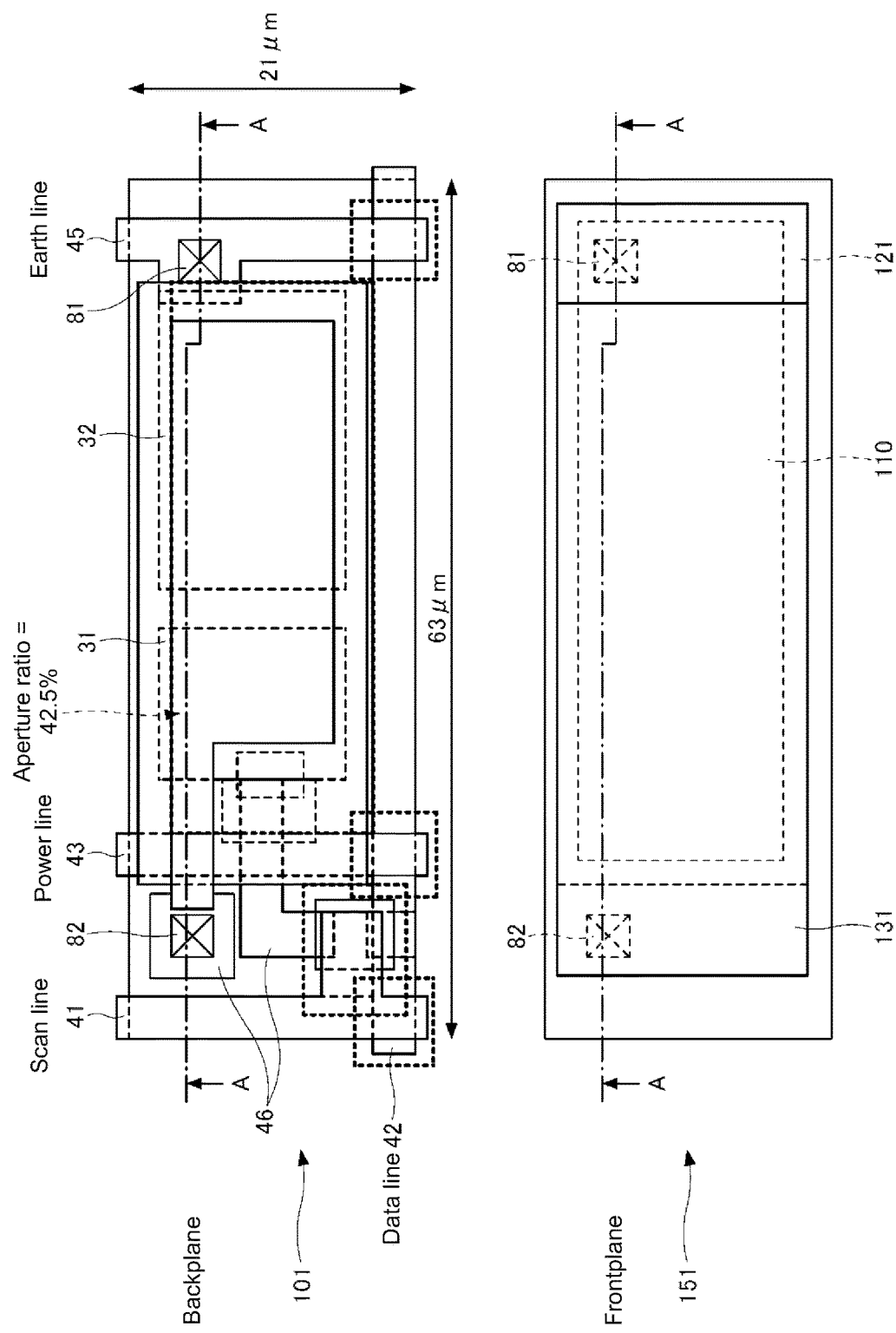
FIG. 3 is a front view of a sub-pixel as an example which shows a high-definition light-emitting display panel pixel structure according to a first embodiment of the present invention.

FIG. 3 is a view showing a high-definition light-emitting display panel sub-pixel structure according to a first embodiment. FIG. 3 illustrates the backplane 101 which includes the TFTs 21, 22, the capacitive elements 31, 32, and the wires 41 through 46, and the frontplane 151 which includes the OLED 121. Electrical connecting portions (VIA) 81, 82 electrically connecting the frontplane 151 and the backplane 101 are provided at two locations. More specifically, the data line 42 extending along the long side of a rectangular exterior form, the scan line 41 extending along the short side of the rectangular exterior form, the earth line 45 extending parallel to the short side on the opposite side of the scan line 41, and the power line 43 extending along the short side between the scan line 41 and the earth line 45 are provided in the backplane 101. An internal wire 46 is also provided for connecting the wires 41 through 45. The capacitive elements 31, 32 having a rectangular exterior form are disposed at an intermediate position between the power line 43 and the earth line 45. Furthermore, the electrical connecting portion 81 electrically connecting the frontplane 151 and the backplane 101 is provided in a region of the earth line 45, and is also provided in a region of the internal wire 46 in the same manner. As shown in Table 1, the sub-pixel has a long size of 63 μm and a short side of 21 μm.

An organic layer 121 including a luminous layer occupying most of the entire region is provided in the frontplane 151, including an area overlapped with the electrical connecting portion 81. In addition, a cathode 131 is provided, including an area overlapped with the electrical connecting portion 82, in such a manner that most of it is overlapped with the organic layer 121.

Figure 4:
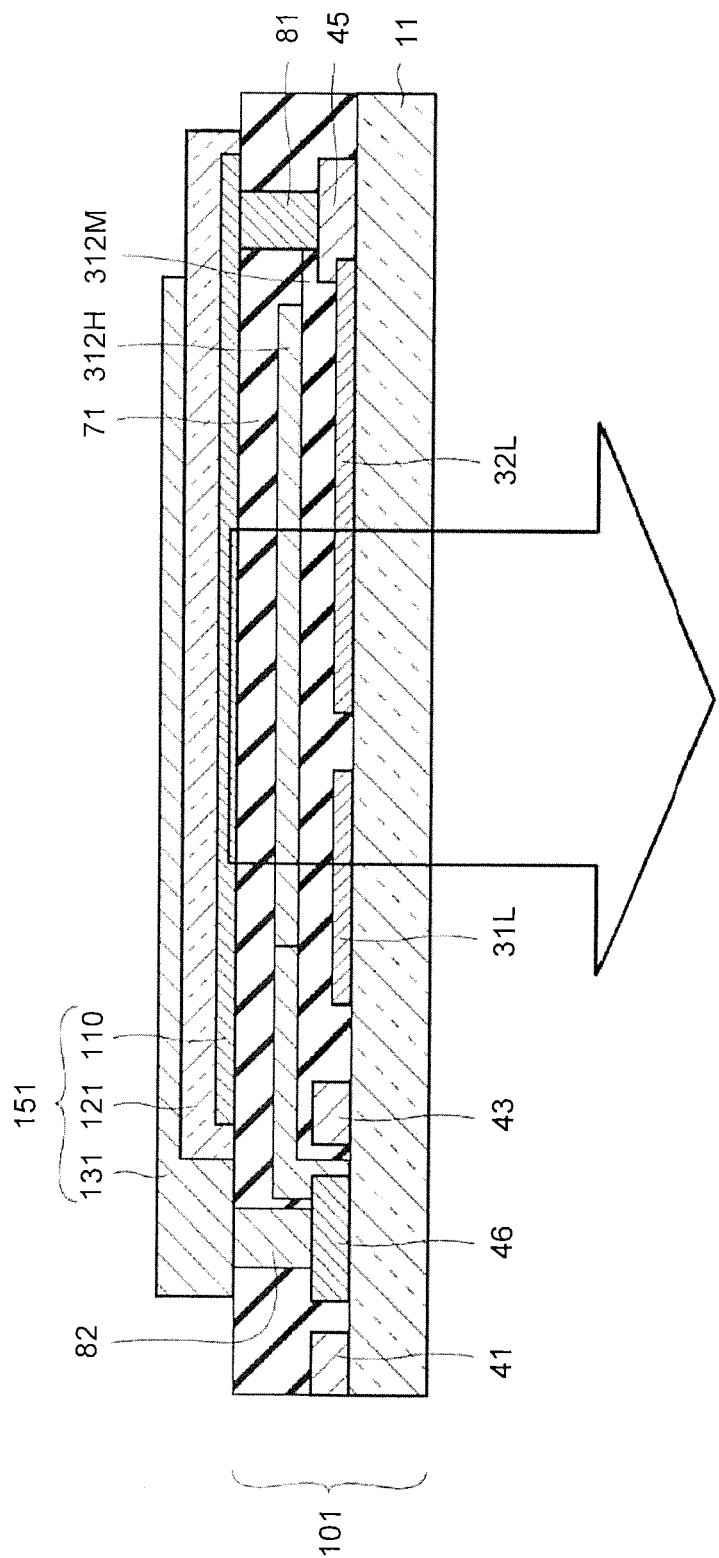
FIG. 4 is a cross-sectional view of a sub-pixel as an example which shows a high-definition light-emitting display panel pixel structure according to a first embodiment of the present invention.

FIG. 4 is a cross-sectional view taken along dot-dash-line A-A of FIG. 3. As shown in FIG. 4, transparent conductive layers 31L, 32L constituting a lower layer of the capacitive elements 31, 32 having sufficiently high light transmittance to cause 50 percent or more of visible light to be transmitted therethrough, the scan line 41, the internal wire 46, the power line 43, and the earth line 45 are provided on the glass substrate 11. An insulating layer 312M is formed on the power line 43 and the transparent conductive layers 31L, 32L so as to cover the power line 43 and the transparent conductive layers 31L, 32L from above. A transparent conductive layer 312H is formed on the insulating layer 312M. The insulating layer 312M is placed between the transparent conductive layers 31L, 32L and the transparent conductive layer 312H, forming the capacitive elements 31, 32. In the capacitive elements 31, 32, all of the transparent conductive layer 31L, 32L, the insulating layer 312M, and the transparent conductive layer 312H are composed of a transparent material and, as a whole, have light transmittance of 50 percent or more in a visible light region, thereby constituting a capacitive element causing light to substantially to be transmitted therethrough. The transparent conductive layers 31L, 32L, 312H may be composed of, for example, indium tin oxide (ITO (InSnO), ZnOx, InOx, InZnOx, SnOx and IGZO (InGaZnO)), while the insulating layer 33M may be composed of SiNx, SiO2, TaOx, HfOx, BaTiO3, PbTiO3 and PbZnTiO3. The electrical connecting portions 81, 82 are formed on the earth line 45 and the internal wire 46, respectively, so as to extend upward and reach the frontplane 151.

The backplane 101 in the frontplane 151 has an anode 110 formed thereon. The organic layer 121 including a luminous layer is provided on the anode 110 so as to cover the anode 110 from above. The organic layer 121 is provided in a region that is overlapped with the electrical connecting portion 81 but not with the electrical connecting portion 82. The organic layer 121 has a cathode 131 provided thereon. The cathode 131 is provided in a region that is overlapped with the electrical connecting portion 82 but not with the electrical connecting portion 81.

As is evident from FIG. 4, the capacitive elements 31, 32, having sufficiently high light transmittance to cause 50 percent or more of visible light to be transmitted therethrough, and the OLED 121 are overlapped with each other in most of the region, thereby causing most of light emitted by the OLED 121 to be radiated from the glass substrate 11 through the capacitive elements 31, 32. With this arrangement, the aperture ratio necessary for light extraction is determined to be 42.5 percent, which is found to be a greater value for the high-definition display unit.

[Second Embodiment]

Figure 5:
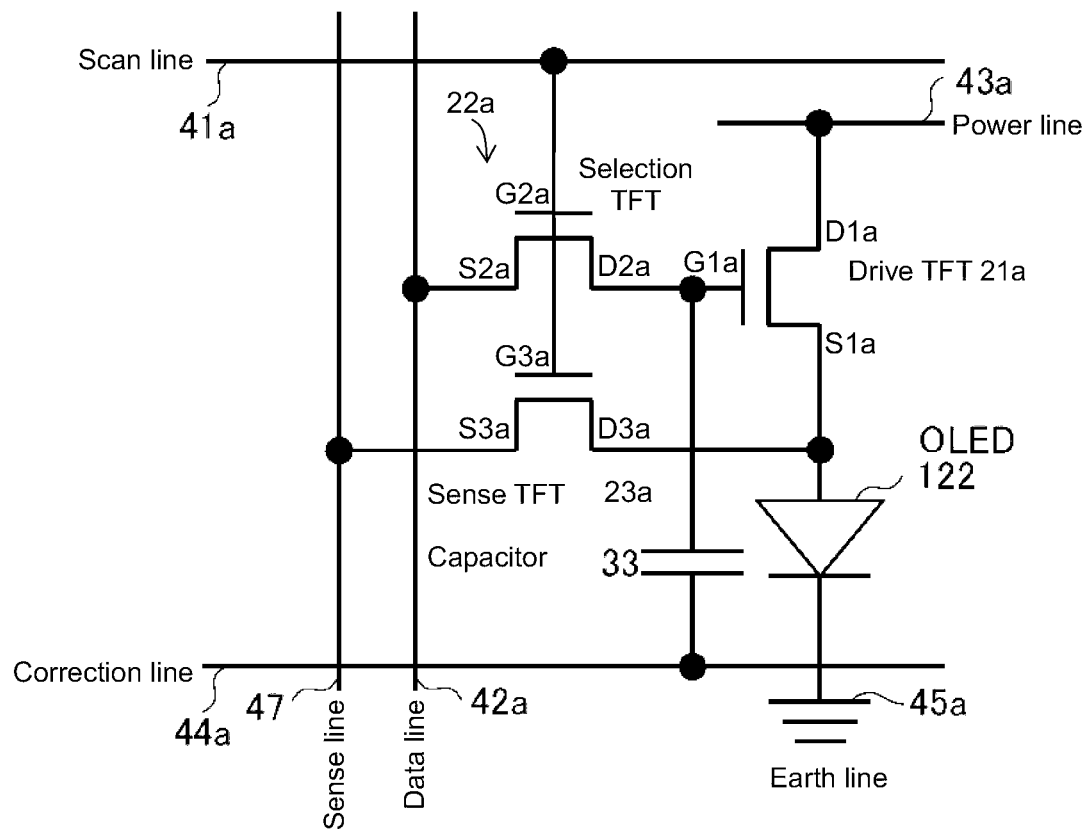
FIG. 5 is a circuit diagram of a sub-pixel as an example which shows a high-definition light-emitting display panel pixel structure according to a second embodiment of the present invention.

FIG. 5 is a circuit diagram of a sub-pixel that has a high-definition light-emitting display panel pixel structure according to a second embodiment of the present invention. In the second embodiment, one sub-pixel has three TFTs 21a, 22a, 23, one capacitive element (capacitor) 33, and one OLED 122, which are connected to a scan line 41a, a data line 42a, a power line 43a, a sense line 47, a correction line 44a, and an earth line 45a.

In FIG. 5, the TFTs 21a, 22a, 23 are both n-channel type junction field-effect transistors. The drain D1a side of the TFT 21a is connected to the power line 43a, and its source S1a side is connected to the anode of the OLED 122. The cathode of the OLED 122 is connected to the earth line 45a. The gate G1a of the drive TFT 21a is connected to one electrode of the capacitor 33 and the drain D2a of the selection TFT 22a. The gate electrode G2a of the selection TFT 22a is connected to the scan line 41a, while its source S2a is connected to the data line 42a. The other electrode of the capacitor 33 is connected to the correction line 44a. As is the case with the selection TFT 22a, the gate G3a of the sense TFT 23 is connected to the scan line 41a, its drain D3a is connected to the anode of the OLED 122, and its source S3a is connected to the sense line 47.

When a voltage is applied to the gate G2a of the selection TFT 22a and the sense TFT 23 through the scan line 41a, the selection TFT 22a and the sense TFT 23a become activated, causing a data signal (voltage) applied to the data line 42a to be applied to the gate G1a of the drive TFT 21a. This results in a predetermined current flowing to the OLED 122, causing the OLED 122 to emit light at luminous intensity corresponding to the data signal. At the same time, the anode voltage of the OLED 122 is output to the sense line 47 through the sense TFT 23a. When no voltage is present in the scan line 41a, the selection TFT 22a and the sense TFT 23a become deactivated, but the gate voltage of the drive TFT 21a is maintained at a constant level by the capacitor 33 until a scan voltage is applied again.

The voltage of the correction line 44a may be normally a ground voltage if a degradation of the OLED 122 is negligibly small. If the deterioration of the OLED 122 causes luminous intensity corresponding to a predetermined signal to become insufficient, the luminous intensity can be corrected by applying a correction voltage during a transition to the data voltage holding.

Table 2 below shows requirements for designing a sub-pixel having a high-definition light-emitting display panel pixel structure according to a second embodiment.

TABLE 2

| Definition | 353 ppi |
|---|---|
| Pixel size | 72 × 72 μm² |
| Sub-pixel size | 72 × 24 μm² |
| Sub-pixel circuit | 3-Tr, 1-Cap, 1-OLED |
| Sub-pixel configuration | Bottom emission |
| | Transparent capacity |
| | Minimum working size: 3.0 μm |
| | VIA, one |
| | TFT low-temperature poly-silicon (LTPS) |
| | Number of masks: 12 |
| Drive circuit | Voltage program with compensating circuit and correction line/sense line |

In this embodiment, a 353 ppi high-definition light-emitting display panel has been designed as the bottom emission type. One pixel is composed of three sub-pixels; red (R), green (G), and blue (B). One sub-pixel has a size of 72 microns by 24 microns, while one pixel has a size of 72 microns by 72 microns. As described above, one sub-pixel includes the three TFTs 21a, 22a, 23a, the capacitive element (capacitor) 33, and the OLED 122. The capacitive element 33 causes 50 percent or more of light in a visible region to penetrate; namely, causes light to substantially penetrate therethrough. The TFTs 21a, 22a, 23 have their active layer formed of low temperature polycrystalline silicon (LTPS). The TFTs 21a, 22a, 23, the wires 41a through 45a, 47 and the OLED 122 have a minimum working size of 3 microns. One of the electrical connecting portions (VIA) electrically connecting the frontplane and the backplane is provided for one sub-pixel.

Figure 6:
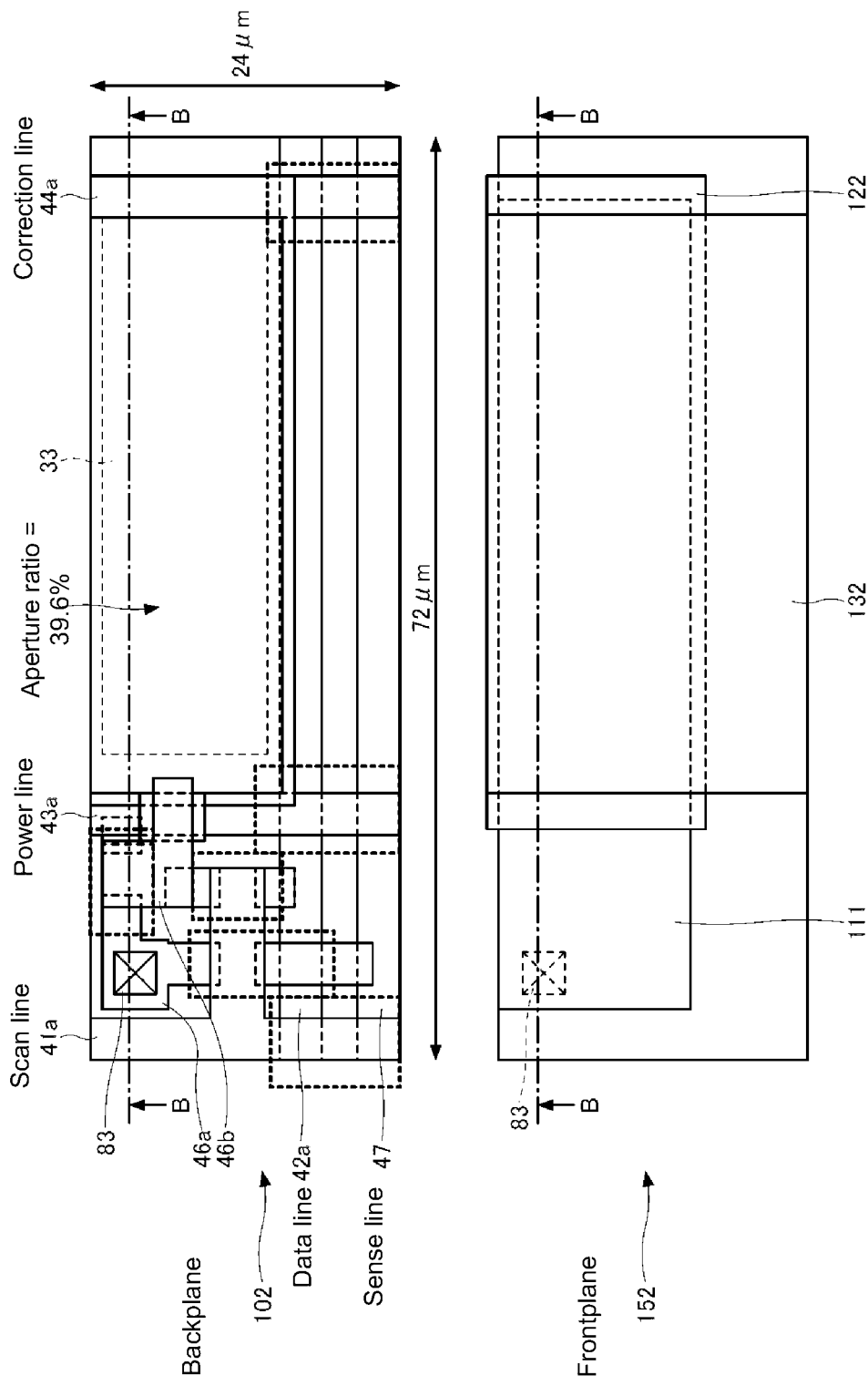
FIG. 6 is a front view of a sub-pixel as an example which shows a high-definition light-emitting display panel pixel structure according to a second embodiment of the present invention.

FIG. 6 is a view showing a sub-pixel having a high-definition light-emitting display panel sub-pixel structure according to a second embodiment. FIG. 6 illustrates the backplane 102 which includes the TFTs 21a, 22a, 23, the capacitive element 33, and the wires 41a through 44a, 46a, 46b, 47, and the frontplane 152 which includes the OLED 122. The electrical connecting portion (VIA) 83 electrically connecting the frontplane 152 and the backplane 102 is provided at one location. In this embodiment, in contrast to the first embodiment, the entire side of one conductive layer (glass substrate side) in the capacitive element 33 is configured to be in contact with the earth line 45a, ensuring that a planarization region is provided in the frontplane 102. In addition, the VIA 83 is provided at only one location, which is advantageous in improving the aperture ratio as compared with the first embodiment.

More specifically, the sense line 47 extending along the lower long side of a rectangular exterior form and the data line 42a that is present on the inside of the sense line 47 and extends along the long side of the exterior form are provided in the backplane 102. In addition, the scan line 41a extending along the left short side of the exterior form, the correction line 44a extending parallel to the right short side on the opposite side of the scan line 41a, and the power line 43a extending between the scan line 41a and the correction 44a so as to be parallel to the short side are provided in the backplane 102. Furthermore, internal wires 46a, 46b that connect the wires 41a through 44a, 47 are provided. The capacitive element 33 having a rectangular outer shape is disposed in a region, including a central region, enclosed the power line 43a, the correction line 44a, and the data line 42a. Only one electrical connecting portion 83 connecting the frontplane 151 and the backplane 101 is provided in a region of the internal wire 46a. As shown in Table 2, the sub-pixel has the 72 μm long side and 24 μm short side.

An anode 111 occupying most of the entire region is provided in the frontplane 152, including an area overlapped with the electrical connecting portion 83. In addition, an organic layer 122 including a luminous layer is provided in such a manner that most of it is overlapped with the anode 111, and a cathode 132 is provided so as to be overlapped with the organic layer 122 and protrude toward the short side.

In the second embodiment, the scan line 41a, the correction line 44a, and the internal wire (inter-connect) 46a are created after formation of the insulating film of the capacitive element 33, resulting in a reduction in the number of masks used in the manufacture. Specifically, the total number of photo masks and metal masks used in the manufacture is 12, as shown in Table 2, indicating that 15 or fewer masks suffice for the manufacture.

Figure 7:
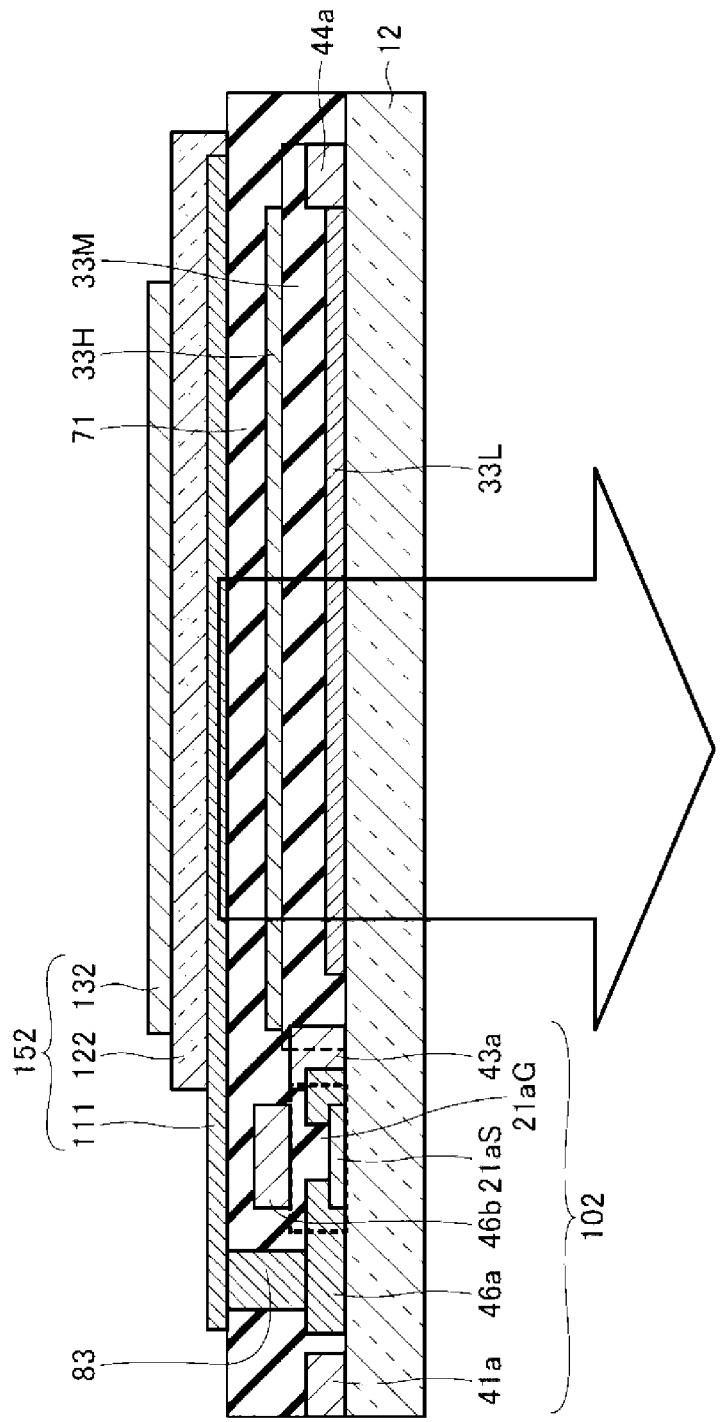
FIG. 7 is a cross-sectional view of a sub-pixel as an example which shows a high-definition light-emitting display panel pixel structure according to a second embodiment of the present invention.

FIG. 7 is a cross-sectional view taken along dot-dash-line B-B of FIG. 6. As shown in FIG. 7, the capacitive elements 33 having sufficiently high light transmittance to cause 50 percent or more of visible light to be transmitted therethrough, the scan line 41a, the internal wire 46a, the power line 43a, and the correction line 44a are provided on the glass substrate 12. Also, a semiconductor active layer 21aS is formed on the glass substrate 12 so as to cross the power line 43 and the internal wire 46a. In addition, a gate insulating layer 21aG is formed on the semiconductor active layer 21aS so as to cover the semiconductor active layer 21aS. Furthermore, an internal wire layer 46b as a second step is formed on the gate insulating layer 21aG.

In a central region, an insulating layer 33M is formed on the transparent conductive layers 33L constituting a lower electrode of the capacitive element 33 so as to cover the transparent conductive layers 33L from above, and a transparent conductive layer 33H constituting an upper electrode of the capacitive element 33 is formed on the insulating layer 33M. The transparent conductive layers 33L and the transparent conductive layer 33H vertically have the insulating layer 33M inserted therebetween, thereby constituting the capacitive element 33. As is the case with the first embodiment, all of the transparent conductive layers 33L, 33H and the insulating layer 33M are composed of a transparent material and, as a whole, constitute the capacitive element 33, having light transmittance of 50 percent or more in a visible light region, that is sufficiently high to cause light to substantially be transmitted therethrough. The transparent conductive layers 33L, 33H may be composed of, for example, indium tin oxide (ITO (InSnO), ZnOx, InOx, InZnOx, SnOx and IGZO (InGaZnO)), while the insulating layer 33M may be composed of SiNx, $SiO_2$ and TaOx, HfOx, BaTiO3, PbTiO3 and PbZnTiO3. In addition, a planarization layer 71 is formed to cover all of the transparent conductive layer 63, the gate insulating layer 21aG, the scan layer 41a, and the internal wire 46a. The electrical connecting portion 83 is formed on the internal wire 46a so as to extend upward and reach the anode 111. The planarization layer 71 is an insulating layer having a flat surface with an arithmetic mean roughness Ra of 10 nm or less.

The anode 111 is formed on the backplane 101 as part of an upper plane 102. The organic layer 122 including the luminous layer is provided on the anode 111. The anode 111 is not entirely covered by the organic layer 122, and part of the anode 111 is exposed to the outside. The cathode 132 is provided on the organic layer 122. The organic layer 122 is not entirely covered by the cathode 132, and part of the organic layer 122 is exposed to the outside. The anode 111 constitutes an electrode on the hole-injecting side of the organic layer 122 including the luminous layer and is connected to the source electrode, one electrode of the drive TFT 21a, through the electrical connecting portion 83. The cathode 132 is an electrode on the electron injection side of the organic layer 122 including the luminous layer and plays a role as a wire, but is configured to exclude the electrical connection portion 83 connecting the backplane 102 and the frontplane 152.

As is evident from FIG. 7, the capacitive elements 33, having sufficiently high light transmittance to cause 50 percent or more of visible light to be transmitted therethrough, and the OLED 122 are overlapped with each other in most of the region, thereby causing most of light emitted by the OLED 122 to be radiated from the glass substrate 12 through the capacitive element 33. With this arrangement, the aperture ratio necessary for light extraction is determined to be 39.6 percent, which is found to be a greater value for the high-definition display unit corresponding to the compensating circuit.

[Third Embodiment]

A high-definition light-emitting display panel pixel structure according to a third embodiment of the present invention is intended to reduce the number of masks by integrating and simultaneously forming the conductive layer of a capacitive element and an internal wire (inter-connect), although its sub-pixel structure is the same as that of the second embodiment.

Table 3 below shows requirements for designing a sub-pixel having a high-definition light-emitting display panel pixel structure according to a third embodiment.

TABLE 3

| | |
|---|---|
| Definition | 353 ppi |
| Pixel size | 72 × 72 μm² |
| Sub-pixel size | 72 × 24 μm² |
| Sub-pixel circuit | 3-Tr, 1-Cap, 1-OLED |
| Sub-pixel configuration | Bottom emission |
| | Transparent capacity |
| | Minimum working size: 3.0 μm |
| | VIA, one |
| | TFT low-temperature poly-silicon (LTPS) |
| | Number of masks: 11 |
| Drive circuit | Voltage program with compensating circuit and correction line/sense line |

As shown in Table 3, the third embodiment requires 11 masks in manufacturing processes, showing it has succeeded in reducing the number of masks by one as compared with the second embodiment, which requires 12 masks. The third embodiment is capable of manufacturing a high-definition light-emitting display panel with 15 or fewer masks in total. Other items are the same as those of Table 2, and their descriptions are omitted.

Figure 8:
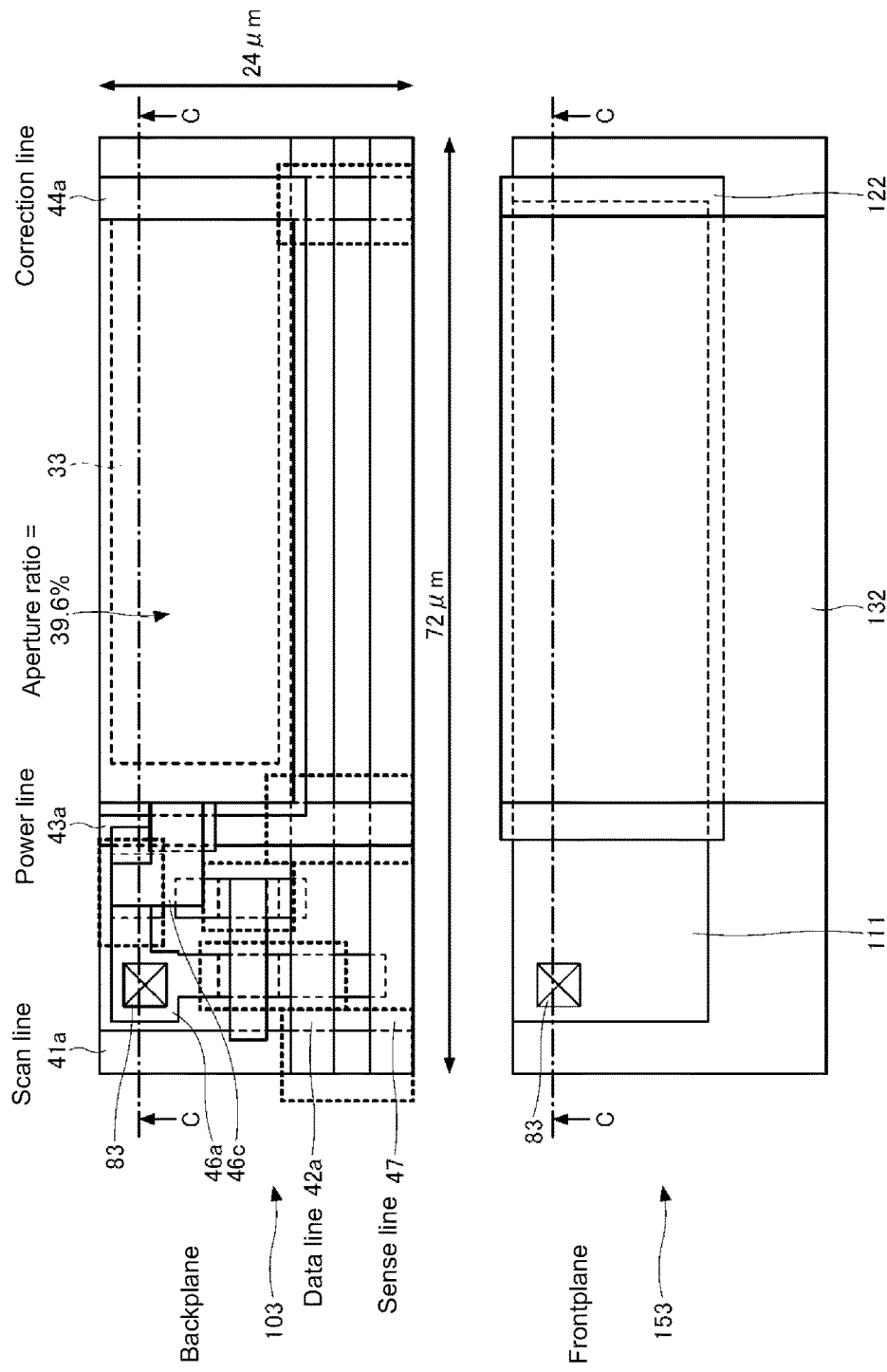
FIG. 8 is a front view of a sub-pixel as an example which shows a high-definition light-emitting display panel pixel structure according to a third embodiment of the present invention.

FIG. 8 is a view showing a sub-pixel having a high-definition light-emitting display panel pixel structure according to a third embodiment. FIG. 8 illustrates the backplane 103 which includes the TFTs 21a, 22a, 23a, the capacitive element 33, and the wires 41a through 44a, 46a, 46c, 47, and the frontplane 153 which includes the OLED 122. Components shown in FIG. 8 are the same as those shown in FIG. 6 of the second embodiment, except that the internal wire 46c is slightly different from the internal wire 46b shown in FIG. 6. The reference numerals and symbols in FIG. 8 refer to the same components as those denoted by the same reference numerals and symbols in FIG. 6, except for the backplane 103, frontplane 153, and internal wire 46c, and repeated descriptions of the same components are omitted.

Figure 9:
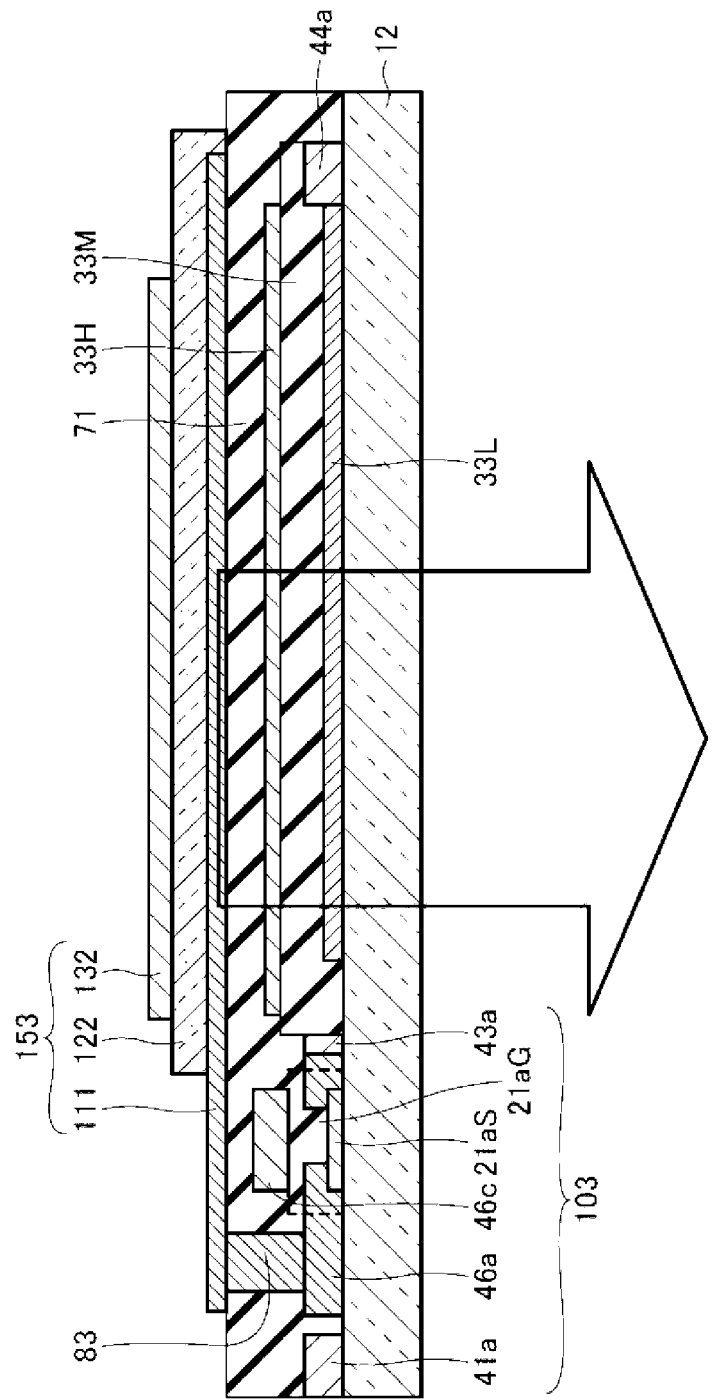
FIG. 9 is a cross-sectional view of a sub-pixel as an example which shows a high-definition light-emitting display panel pixel structure according to a third embodiment of the present invention.

FIG. 9 is a cross-sectional view taken along dot-dash-line C-C of FIG. 8. Although the third embodiment shown in FIG. 9 is approximately the same as the second embodiment shown in FIG. 7, the transparent conductive layer 33H and the internal wire 46c are simultaneously formed for the purpose of manufacturing. By integrating and simultaneously forming the transparent conductive layer 33H, an upper electrode of the capacitive element 33, and the internal wire 46c, the third embodiment has succeeded in reducing the number of masks required for manufacturing processes by one, as compared with the second embodiment.

Other components are the same as those shown in FIG. 7 of the second embodiment. Accordingly, the reference numerals and symbols in FIG. 9 refer to the same components as those denoted by the same reference numerals and symbols in FIG. 7, and repeated descriptions of the same components are omitted.

As is the case with the second embodiment, the high-definition light-emitting display panel pixel structure according to the third embodiment implements a high aperture ratio while simplifying manufacturing processes and reducing manufacturing cost through the reduction of the number of masks used in manufacturing processes.

A high-definition light-emitting display panel pixel structure described in the first to third embodiments constitutes a high-definition light-emitting display panel provided with such a pixel structure. In addition, such a display panel, when provided with other components, such as a display panel drive circuit, a control circuit, an image processing circuit, and an enclosure, constitutes an organic electroluminescence display unit.

The present invention is described with reference to, but is not limited to, the foregoing preferred embodiments. Various modifications are conceivable within the scope of the present invention.

CITATION LIST

Patent Literature

PTL 1: Japanese Unexamined Patent Application Publication No. 1998-232628
PTL 2: Japanese Unexamined Patent Application Publication No. 2001-76885
PTL 3: Japanese Unexamined Patent Application Publication No. 2003-297573

Non Patent Literature

NPL 1: Page 126 of "Organic EL Display" by Tokito, Adachi, and Murata, published by Ohmsha, Limited (2004)

PARTS LIST

Drive TFT 21, 21*a*
Selection TFT 22, 22*a*
Sense TFT 23
Capacitor 31, 32, 33
Transparent conductive layer 31L, 32L, 33L, 33H, 312H
Insulating layer 33M, 312M
Scan line 41, 41*a*
Data line 42, 42*a*
Power line 43, 43*a*
Correction line 44, 44*a*
Earth line 45, 45*a*
Internal wire 46, 46*a* to 46*c*
Sense line 47
OLED 121, 122
Backplane 101 to 103
Frontplane 151 to 153

The invention claimed is:

1. A pixel structure for use in a high-definition light-emitting display panel having a plurality of sub-pixels, comprising:
a glass substrate;
a backplane that is disposed on the glass substrate and includes at least one capacitor having sufficiently high light transmittance to cause 50 percent or more of light to be transmitted therethrough;
a frontplane that is disposed on the backplane, the frontplane including a light-emitting element disposed so as to radiate light towards the glass substrate and the backplane when current flows through the light-emitting element;
an electrical connecting portion that provides an electrical connection between the frontplane and the backplane, three or fewer of such electrical connecting portions being provided on one of the sub-pixels; and
a switching element that is provided on the backplane and can be selectively activated to control electricity distribution to the light-emitting element, the at least one capacitor being connected to the switching element so as to maintain current flow through the light-emitting element when the switching element becomes deactivated,
wherein an aperture ratio from which light is transmitted through the glass substrate is 20 percent or more, and
wherein at least one of the electrical connecting portions that provide an electrical connection between the frontplane and the backplane is disposed so as to connect one electrode of the switching element included in the backplane and a hole-injecting side electrode of the light-emitting element included in the frontplane.

2. The pixel structure for use in the high-definition light-emitting display panel according to claim 1, wherein
the capacitive element has a conductive layer;
the backplane includes at least one wire; and
the conductive layer is substantially polygonal and its side is in electrical contact with or integral with at least one of the wires.

3. The pixel structure for use in the high-definition light-emitting display panel according to claim 1, wherein
the capacitive element has an insulating layer;
at least one wire including the internal wire inside the backplane is located in a layer above the insulating layer of the capacitive element that causes light to be transmitted therethrough.

4. The pixel structure for use in the high-definition light-emitting display panel according to claim 1, wherein
the capacitive element has the conductive layer; and
at least one wire including the internal wire inside the backplane is integral with the conductive layer of the capacitive element.

5. The pixel structure for use in the high-definition light-emitting display panel according to claim 1, wherein the switch is a thin film transistor having an active layer of a silicon, metallic oxide, or organic matter.

6. The pixel structure for use in the high-definition light-emitting display panel according to claim 1, wherein the total number of photo masks and metal masks for use in a manufacturing process is 15 or fewer.

7. The pixel structure for use in the high-definition light-emitting display panel according to claim 1, wherein two of the electrical connecting portions that provide an electrical connection between the frontplane and the backplane are provided for one of the sub-pixels.

8. The pixel structure for use in the high-definition light-emitting display panel according to claim 1, wherein one of the electrical connecting portions that provide an electrical connection between the frontplane and the backplane is provided for one of the sub-pixels.

9. The pixel structure for use in the high-definition light-emitting display panel according to claim 1, wherein the capacitive element causes 50 percent or more of light to be transmitted therethrough in a visible light region.

10. The pixel structure for use in the high-definition light-emitting display panel according to claim 1, wherein 50 percent or more of an area occupied by the capacitive element is disposed so as to be overlapped with the light-emitting element, when viewed from one side of the glass substrate.

11. The pixel structure for use in the high-definition light-emitting display panel according to claim 1, wherein an insulating planarization layer is disposed on the backplane.

12. The pixel structure for use in the high-definition light-emitting display panel according to claim 1, wherein an electron injecting side electrode of the light-emitting element included in the frontplane is provided with a wire and does not include in one of the sub-pixels the electrical connecting portion that provides an electrical connection between the frontplane and the backplane.

13. The pixel structure for use in the high-definition light-emitting display panel according to claim 1, wherein the frontplane and the backplane respectively include at least one earth line.

14. The pixel structure for use in the high-definition light-emitting display panel according to claim 1, wherein one of the sub-pixels includes at least two switching elements, at least one capacitive element, and at least one light-emitting element.

15. The pixel structure for use in the high-definition light-emitting display panel according to claim 1, wherein one of the sub-pixels includes a wire for measurement of the voltage of one electrode of the light-emitting element.

16. The pixel structure for use in the high-definition light-emitting display panel according to claim 1, wherein one of the sub-pixels includes a wire for adjustment of the voltage of one electrode of the capacitive element.

17. An organic electroluminescence display unit, including a high-definition light-emitting display panel having a pixel structure according claim 1.

18. The pixel structure for use in the high-definition light-emitting display panel according to claim 5, wherein
the backplane includes a linear wiring pattern extending in the pixel;
the switch is the thin film transistor; and
an end of the linear wiring pattern is applied as source and drain electrode terminals of the thin film transistor.

19. The pixel structure for use in the high-definition light-emitting display panel according to claim 5, wherein four or fewer of the thin film transistors are provided for one of the sub-pixels.

20. A pixel structure for use in a high-definition light-emitting display panel having a plurality of sub-pixels, comprising:
a glass substrate;
a backplane that is disposed on the glass substrate and includes at least one capacitor having sufficiently high light transmittance to cause 50 percent or more of light to be transmitted therethrough;
a frontplane that is disposed on the backplane, the frontplane including a light-emitting element disposed so as to radiate light towards the glass substrate and the backplane when current flows through the light-emitting element;
an electrical connecting portion that provides an electrical connection between the frontplane and the backplane, three or fewer of such electrical connecting portions being provided on one of the sub-pixels; and
a switching element that is provided on the backplane and can be selectively activated to control electricity distribution to the light-emitting element, the at least one capacitor being connected to the switching element so as to maintain current flow through the light-emitting element when the switching element becomes deactivated,
wherein an aperture ratio from which light is transmitted through the glass substrate is 20 percent or more, and
wherein the light emitting element includes an anode, an organic layer, and a cathode, and wherein a portion of the organic layer is exposed.

21. A pixel structure for use in a high-definition light-emitting display panel having a plurality of sub-pixels, comprising:
a glass substrate;
a backplane that is disposed on the glass substrate and includes at least one capacitor having sufficiently high light transmittance to cause 50 percent or more of light to be transmitted therethrough;
a frontplane that is disposed on the backplane, the frontplane including a light-emitting element disposed so as to radiate light towards the glass substrate and the backplane when current flows through the light-emitting element;
an electrical connecting portion that provides an electrical connection between the frontplane and the backplane, three or fewer of such electrical connecting portions being provided on one of the sub-pixels; and
a switching element that is provided on the backplane and can be selectively activated to control electricity distribution to the light-emitting element, the at least one capacitor being connected to the switching element so as to maintain current flow through the light-emitting element when the switching element becomes deactivated,
wherein an aperture ratio from which light is transmitted through the glass substrate is 20 percent or more, and
wherein the light emitting element includes an anode, an organic layer, and a cathode, and wherein a portion of the anode is exposed.

* * * * *